US006436760B1

United States Patent
Wong et al.

(10) Patent No.: US 6,436,760 B1
(45) Date of Patent: Aug. 20, 2002

(54) METHOD FOR REDUCING SURFACE OXIDE IN POLYSILICON PROCESSING

(75) Inventors: Kwong H. Wong, Wappingers Falls; Ashima B. Chakravarti; Satya N. Chakravarti, both of Hopewell Junction; Subramanian S. Iyer, Mount Kisco, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/838,418

(22) Filed: Apr. 19, 2001

(51) Int. Cl.[7] .......................................... H01L 21/8242
(52) U.S. Cl. ...................... 438/243; 438/404
(58) Field of Search ................. 438/238, 240, 438/262, 404, 430, 949, 233, 237, 243, 295

(56) References Cited

U.S. PATENT DOCUMENTS

| | | | | |
|---|---|---|---|---|
| 4,621,414 A | * | 11/1986 | Iranmanesh ................. | 29/576 |
| 5,308,783 A | * | 5/1994 | Krautschneideer et al. . | 438/237 |
| 5,384,272 A | * | 1/1995 | Ibok et al. ................... | 438/262 |
| 5,754,263 A | | 5/1998 | Akiyama et al. | |
| 5,828,084 A | | 10/1998 | Noguchi et al. | |
| 5,977,586 A | * | 11/1999 | Crisenza et al. ............ | 257/326 |
| 6,022,786 A | | 2/2000 | Franosch et al. | |
| 6,037,620 A | | 3/2000 | Hoenigschmid et al. | |
| 6,162,671 A | * | 12/2000 | Lee et al. ................... | 438/238 |
| 6,335,238 B1 | * | 1/2002 | Hattangady et al. ........ | 438/240 |

OTHER PUBLICATIONS

K. Prabhakaran et al, Oxidation of GE(100) and GE(111) Surfaces: An UPS and XPS Study, Surface Science 325 (1995) 263–271.
A.I. Abdul–Rahim, et al., Improved Control of Polysilicon Emitter Interfacial Oxide Using A UHV–Compatible LPCVD Cluster Tool, IEEE/MTT/ED/AP/LEO Societies Joint Chapter United Kingdom and Republic of Ireland Section, and 1997 Workshop on High Performance Electron Devices for Microwave and Optoelectronis Applications, EDMO London, UK 24–25, Nov. 1997, pp. 232–236.
K. Prabhakaran et al., Thermal Decomposition Pathway of GE and SI Oxides: Observation of a Distinct Difference, Thin Solid Films 369 (2000) 289–292.
L. Nesbit, et al., A 0.6MM$^2$ 256MB Trench DRAM Cell With Self–Aligned Buried Strap (Best), IDED Tech. Digest, 1993, p. 627.

* cited by examiner

Primary Examiner—David Nelms
Assistant Examiner—Phuc T. Dang
(74) Attorney, Agent, or Firm—Darryl L. Neff; McGuire Woods LLP

(57) ABSTRACT

A method for removing surface oxide from polysilicon includes depositing a very thin layer of germanium (e.g. monolayers in thickness) over the polysilicon immediately before a subsequent polysilicon deposition step, and then heating the germanium-coated polysilicon in a vacuum to sublime (remove) volatile germanium oxide. This method is applied to formation of a trench capacitor, which uses either doped amorphous silicon or doped amorphous SiGe material in the formation of the electrodes.

19 Claims, 9 Drawing Sheets

METHOD FOR REDUCING SURFACE OXIDE IN POLYSILICON PROCESSING

BACKGROUND OF THE INVENTION

1. Field of the Invention

This invention generally relates to semiconductor device fabrication, and more particularly to a method for removing surface oxide layers from polysilicon material. The invention also relates to a method for making a trench capacitor which has improved performance as a result of surface oxide removal.

2. Description of the Related Art

Polysilicon is a commonly used material in semiconductor devices. It is used to form, for example, the gate structure of deep trench capacitors in dynamic random access memory (DRAM) cells, thin film capacitors in high-density static random access memory (SRAM) and video display devices, emitters of bipolar transistors, and conductive glue layers in devices such as solar cell panels.

One problem of using polysilicon is that it easily oxidizes in air. The resulting silicon oxide is insulating and therefore creates a high contact resistance between the polysilicon and subsequent contacts.

Conventionally, surface oxide is removed from polysilicon by dipping the semiconductor wafer in an HF bath. The wafer is the washed in DI water and then dried before subsequent processing of the polysilicon. This approach is undesirable because after the HF dip is performed, the wafer must be processed within a short time window or the oxide will re-grow. In fact, as soon as the wafer is removed from the HF bath, a very thin native oxide will immediately grow on the polysilicon.

Techniques have been proposed for removing the residual native oxide after HF dip. One technique involves performing a hydrogen bake at a pressure of 1 Torr for 15 minutes at 900° C. See, for example, "Improved Control of Polysilicon Emitter Interfacial Oxide using a UHV-Compatible LPCVD Cluster Tool" by A. I. Abdul-Rahim, C. D. Marsh, P. Ashburn, and G. R. Booker, IEEE/MTT/ED/AP/LEO Societies Joint Chapter United Kingdom and Republic of Ireland Section, and 1997 Workshop on High Performance Electron Devices for Microwave and Optoelectronics Applications. EDDO London, UK Nov. 24–25, 1997, p 232–6. There are two drawbacks to this approach. First, hydrogen can diffuse into the device, thereby causing a shift in its electrical characteristics. Second, the relative long bake at 900° C. causes redistributions of dopants which affects the device characteristics.

Removal of surface oxide from polysilicon is especially important in improving the quality of conductor plates in trench capacitors. The conventional approach to fabricating these plates involves filling the trench halfway with arsenic (As)-doped polysilicon, depositing a collar oxide, and then filling the remainder of the trench with more heavily doped polysilicon after etching away the top oxide layer on the surface of the bottom polysilicon.

Because of the faster oxidation rate of doped polysilicon compared with amorphous silicon, additional oxide is formed on the polysilicon at the bottom half of the trench. Complete removal of this oxide without sacrificing the collar oxide is very difficult due to the small opening and high aspect ratio of the trench. The oxide remaining at the two polysilicon interfaces creates a high contact resistance which degrades the performance of the overall device. For example, in the case where the trench capacitor is employed as a DRAM capacitor, this high contact resistance significantly limits the charging and discharging speeds of the DRAM cells.

In view of the foregoing considerations, it is therefore clear that a need exists for a better method of removing oxide from polysilicon during semiconductor device fabrication, and moreover one which may be used to form a trench capacitor with less contact resistance and faster charging/discharging times than conventional devices of this type.

SUMMARY OF THE INVENTION

It is a first object of the present invention to provide an improved method for removing oxide from polysilicon during semiconductor device fabrication.

It is another object of the present invention to achieve the first object by depositing a barrier layer on the polysilicon that will enable a complete removal of surface oxide on the polysilicon.

It is another object of the present invention to provide a method for removing oxide from polysilicon which does not require the polysilicon to be processed after HF dip within any time window, let alone a short time window as conventional methods require in order to prevent re-growth of surface oxide on the polysilicon, thereby making the invention easier to implement compared with these conventional methods.

It is another object of the present invention to provide a method for removing oxide from polysilicon which provides enhanced protection for wafers during polysilicon deposition in vertical furnaces without load lock.

It is another object of the present invention to apply the aforementioned method to form the conductor plates of a trench capacitor, which conductor plates allow the trench capacitor to realize faster charging and discharging times.

It is another object of the present invention to provide a method for forming a trench capacitor which has less contact resistance than capacitors made by conventional methods, wherein the reduced contact resistance is achieved by filling the trench with heavily doped silicon-germanium material instead of doped polysilicon.

The foregoing and other objects of the invention are achieved by providing a method for removing surface oxide from polysilicon during semiconductor device fabrication. The method includes depositing a barrier layer on the surface oxide layer, baking the polysilicon, surface oxide, and barrier layers until the barrier layer reacts with the surface oxide layer to form a volatile sub-oxide layer, and then subliming the sub-oxide layer away, As a result of these steps, the surface of the polysilicon layer is completely oxide-free. The barrier layer may include one or more monolayers of germanium. In an optional step, a second polysilicon layer is deposited on the oxide-free surface of the first polysilicon layer, to thereby form an oxide-free polysilicon-polysilicon interface. Such an interface is highly desirable in integrated circuit devices because it reduces contact resistance, thereby improving device performance. Alternatively, doped amorphous silicon or doped amorphous SiGe layers may be deposited in place of the polysilicon layers. As used herein, and in the claims appended herein, amorphous silicon and amorphous SiGe are deposited silicon which may be deposited in place of deposited polysilicon The method continues by depositing a second polysilicon layer on the oxide-free surface of the first polysilicon layer.

Like the first polysilicon layer, the second polysilicon layer also has a surface oxide when initially formed. To remove this oxide, a barrier layer is deposited on the surface oxide layer of the second polysilicon layer, and then the layers are baked until the barrier layer reacts with the surface oxide layer to form a volatile sub-oxide layer. The sub-oxide layer is then removed by subliming leaving the second polysilicon layer with an oxide-free surface. A third polysilicon layer may then be deposited on the second polysilicon layer. In the foregoing steps, the barrier layers may be made from germanium and in place of the polysilicon layers, doped amorphous silicon or doped amorphous SiGe maybe deposited. The resulting oxide-free interfaces between the deposited silicon layers advantageously reduce contact resistance and increases charge/discharge times of the resulting device thereby outperforming conventional trench capacitors

BRIEF DESCRIPTION OF THE DRAWINGS

FIG. 1(a) shows polysilicon with a surface oxide; FIG. 1(b) shows the deposition of a barrier layer on the surface oxide; FIG. 1(c) shows an oxide-free polysilicon surface resulting from a vacuum bake and subsequent sublime; and FIG. 1(d) shows the deposition of a second polysilicon layer on the oxide-free surface of the first polysilicon layer.

FIG. 2 shows the formation of a trench in a silicon substrate.

FIG. 3 shows the deposition of a thin layer of arsenic-doped glass within the trench.

FIG. 4 shows filling the trench with a resist material.

FIG. 5 shows removal of the resist material up to a buried plate depth.

FIG. 6 shows removal of the glass and remaining resist material from the top pan of the trench.

FIG. 7 shows the deposition of a CAP TAOS layer in the trench.

FIG. 8 shows the formation of a thermal drive-in around the trench.

FIG. 9 shows removal of the CAP TAOS and bottom glass layers.

FIG. 10 shows deposition of a node dielectric in the trench.

FIG. 11 shows deposition of polysilicon in the trench

FIG. 12 shows etching back a top part of the node dielectric and polysilicon.

FIG. 13 shows formation of an oxide layer in the trench.

FIG. 14 shows performing an etch to expose a bottom portion of the oxide.

FIG. 15 shows removal of residual oxide by an HF/water rinse.

FIG. 16 shows the deposition of a barrier layer on the polysilicon surface.

FIG. 17 shows the result of baking the structure of FIG. 16 in a vacuum, followed by a subliming process to remove the sub-oxide.

FIG. 18 shows depositing a second polysilicon layer on the oxide-free surface of the first polysilicon layer.

FIG. 19 shows etching the second polysilicon layer back to trench level.

FIG. 20 shows removal of the oxide residue on the top of the recessed polysilicon.

FIG. 21 shows depositing a barrier layer over the second polysilicon layer.

FIG. 22 shows the result of baking the structure of FIG. 21 in a vacuum, followed by a subliming process to remove the sub-oxide.

FIG. 23 shows the deposition of a third polysilicon layer on the oxide-free surface of the second polysilicon layer.

DESCRIPTION OF THE PREFERRED EMBODIMENTS

The present invention is, in one respect, a method for removing surface oxide layers from polysilicon material. The invention is also a method for making a trench capacitor which has improved performance as a result of this surface oxide removal. These methods are discussed in seriatim below.

Figure 1A:
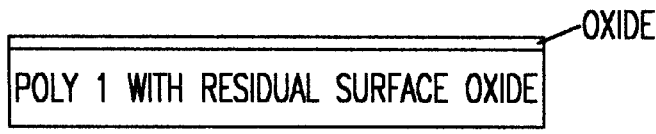
FIGS. 1(a)–1(d) show steps included in a preferred embodiment of the method of the present invention for removing surface oxide from polysilicon material.

FIGS. 1(a)–1(d) show steps included in a preferred embodiment of the method of the preset invention for removing surface oxide from polysilicon material. In FIG. 1(a), this surface oxide is shown as a residual oxide layer 2 formed on a polysilicon layer 1. The surface oxide typically forms on the polysilicon during trench sidewall collar formation. Conventionally, attempts were made to remove this oxide by an anisotropic reactive ion etch process. However, if the polysilicon source is not perfectly planar (often times it has a V-shape groove), oxide films are left between polysilicon layers. This oxide degrades device performance and may advantageously be removed in accordance with the method of the present invention. The polysilicon layer shown in FIG. 1(a) may be one incorporated in any of a variety of integrated circuit devices, including capacitors, gate structures, and contacts to name a few.

Figure 1B:
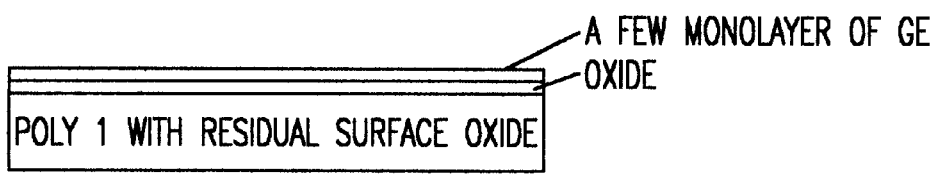

The method begins by depositing one or more monolayers of germanium 3 over the oxide layer, as shown in FIG. 1(b). This deposition step may be performed in accordance with known techniques such as LPCVD. The total germanium layer thickness should be kept small enough so that all the germanium will be converted to sub-oxide and sublimed away, as will be explained in greater detail below. Preferably, the germanium layer(s) are deposited to a thickness of between 10 Å and 30 Å.

Figure 1C:
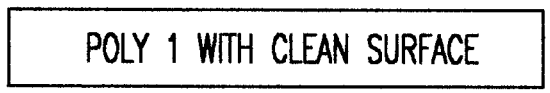

The method continues by baking the polysilicon, oxide, and germanium layers in a vacuum, which is preferably less than 10 micro Torr in pressure and between 450 to 700° C. for 5 to 10 minutes. During baking, the germanium monolayer(s) will react with the residual surface oxide to form volatile germanium sub-oxide. This volatile sub-oxide is then sublimed away leaving a completely oxide-free polysilicon surface, as shown in FIG. 1(c). The subliming step may be performed in a high vacuum chamber fitted with a conventional heating element or a rapid thermal-annealing infrared light source.

Figure 1D:
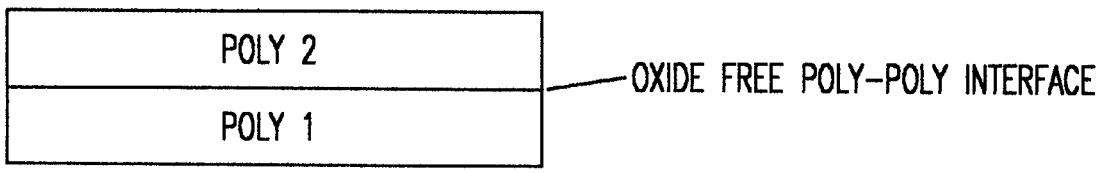

Many integrated circuits require stacked polysilicon layers. In an optional step of the method, a second polysilicon layer 4 may be deposited over the first polysilicon layer as shown in FIG. 1(d). Because the surface of the first polysilicon layer is now oxide-free, an oxide-free poly-poly interface is formed between layers 1 and 4. This oxide-free interface is advantageous because results in a device with improved performance in terms of reduced contact resistance. Also, in the case of deep trench capacitors used in DRAMs, an oxide-free polysilicon-to-polysilicon interface film will increase memory performance due to a reduction in RC time constant As a result, a higher charge level can be stored in the capacitor within the same time window in a memory cycle. The oxide-fee surface also helps improve DRAM availability.

The present invention is also a method for making an improved trench capacitor based on the surface-oxide removal technique shown in FIG. 1. Essentially, the method involves the use of a barrier layer which allows for the complete removal of surface oxide from one or more polysilicon layers used to form the electrode(s) of the capacitor. In one embodiment, a germanium barrier layer is used, and in a second embodiment a SiGe barrier layer is used.

Figure 2:
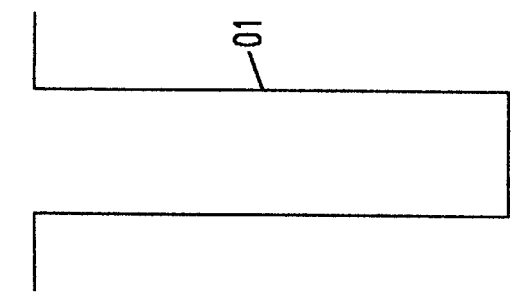

Referring to FIG. 2, a first embodiment of the method of the present invention for forming an improved trench capacitor begins by forming a trench 1 in a silicon substrate, preferably to a depth of 6 microns. The trench may be formed in accordance with known techniques such as reactive ion etching of silicon using a fluorinated chemistry through an oxide window defined lithographically by a mask layer. The silicon is etched up to a specified depth using the oxide layer on the top surface as a mask. Those skilled in the an can appreciate that the six-micron trench depth is only illustrative of the present invention and that trenches of other depths may just as easily be formed.

Figure 3:
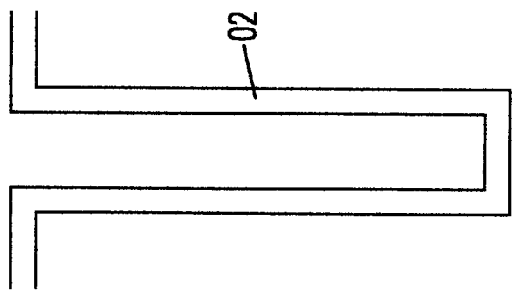

A second step, shown in FIG. 3, includes conformally depositing a thin layer of arsenic-doped glass (ASG) 2 within the trench. This step may be performed by LPCVD or arsenic glass deposition. The ASG layer is preferably between 200 and 400 Å.

Figure 4:
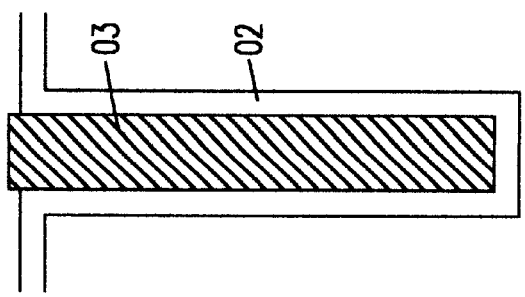

A third step, shown in FIG. 4, includes using conventional techniques for filling the trench with a resist material 3 such as Az.

Figure 5:
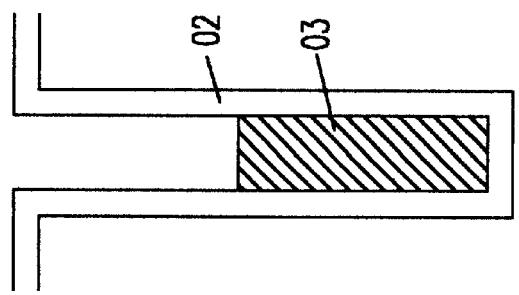
FIGS. 2–23 show steps included in a first embodiment of a method of forming a trench capacitor in accordance with the present invention.

A fourth step, shown in FIG. 5, includes performing a dry etch, for example, in a chemically assisted plasma etcher, to remove a portion of the resist material from the trench. This step leaves resist material up to a desired buried plate depth PD of the capacitor, which, for example, may be around one micron. Significantly deeper depths than one micron may be used, however these depths are undesirable because a reduction in deep trench capacitance may result due to loss of trench area On the other hand, shallower depths may used, but if significantly shallower an increase in trench leakage may result due to a parasitic leakage mechanism in the trench.

Figure 7:
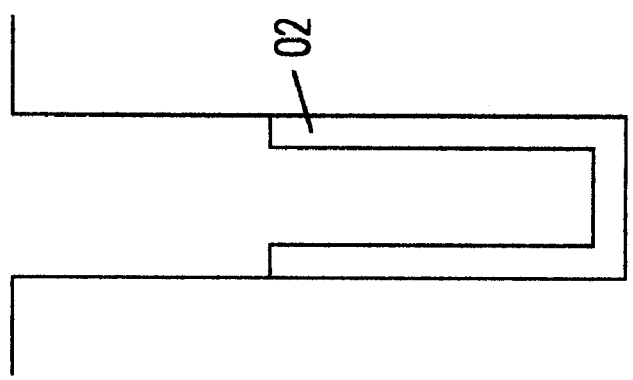
Figure 6:
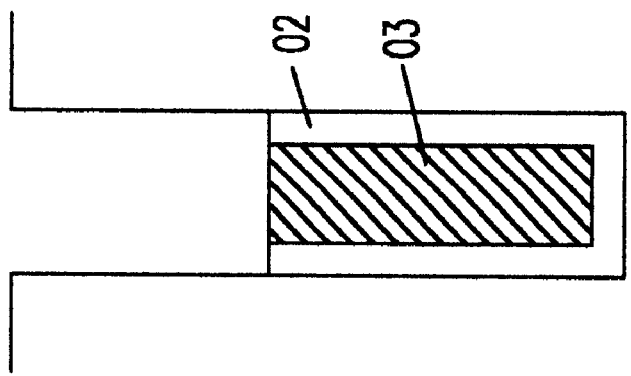

A fifth step, shown in FIG. 6, includes performing a wet etch to remove the portion of the ASG layer 2 from the top part of the trench (i.e,. the portion not covered by the resist material). The remaining resist material 3 is then removed, for example, by wet chemical removal, thereby leaving only the ASG layer at the lower half of the trench, as shown in FIG. 7.

Figure 8:
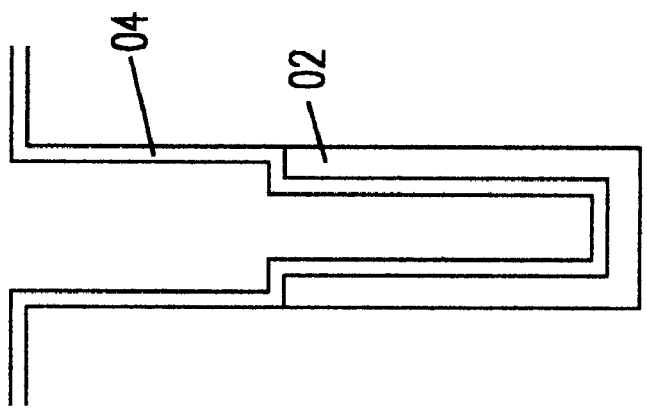

A sixth step, shown in FIG. 8, includes conformally depositing a CAP TEOS layer 4 along the bottom and sidewalls of the trench, including along the portions of the trench covered by the ASG layer. This step may be performed by known low pressure CVD TEOS deposition techniques.

Figure 9:
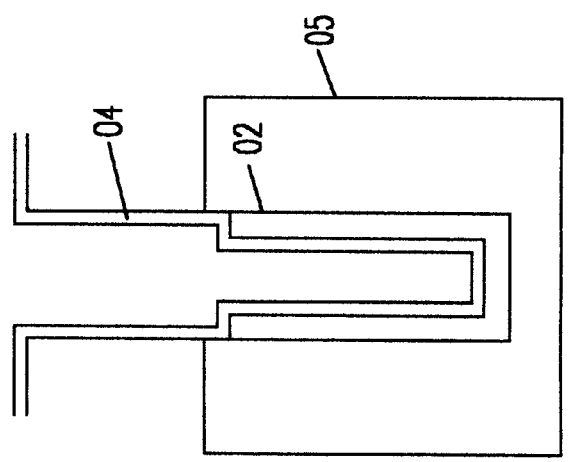

A seventh step, shown in FIG. 9, involves forming a thermal drive-in around the trench which leads to the formation of a buried capacitor plate 5. As those skilled in the art can appreciate, a thermal drive-in is an annealing performed at a given temperature for impurity diffusion and electrical activation. Preferably, the drive-in is formed by a furnace anneal at a specified temperature of, for example, 1000° C. The thickness of the thermal drive-in under the bottom of the trench is, for example, 0.5 microns. The depth of the thermal drive-in under the trench depends on the temperature. Usually, it is preferable to make the trench six or seven microns deep. Under these circumstances, the outdiffusion can be 0.5 microns around the trench. The drive-in then extends along the sides of the trench up to the desired buried plate depth PD or slightly above. Preferably, the width of the thermal drive-in portions along the sides of the trench are the same.

Figure 10:
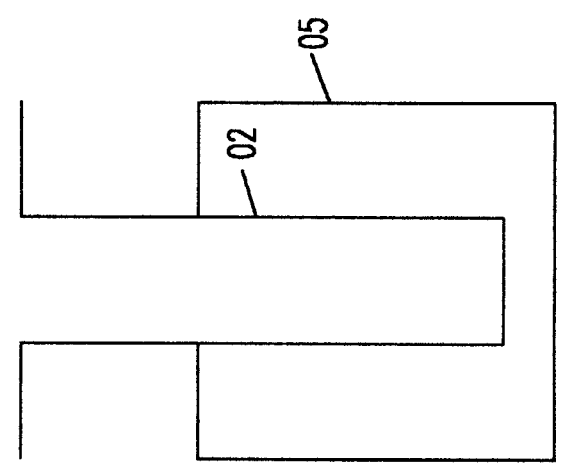

An eighth step, shown in FIG. 10, includes performing a wet etch to remove the CAP TEOS layer 4 and the bottom ASG layer 2.

Figure 11:
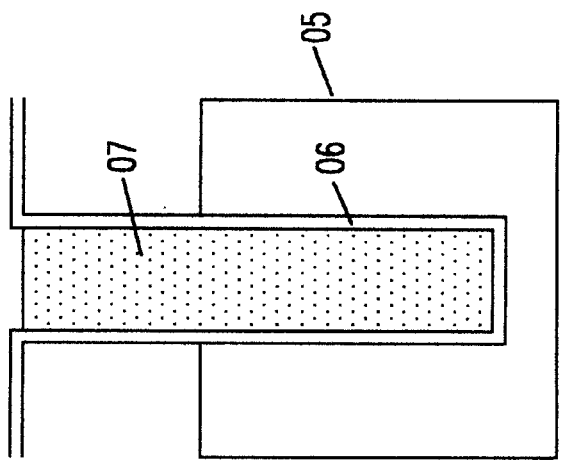

A ninth step, shown in FIG. 11, includes depositing a thin layer of a node dielectric 6 on the sidewalls and bottom of the trench. This may be performed by known CVD node dielectric deposition techniques. Preferably, the node dielectric is an oxynitride that is 2–10 nm thick because this material meets the leakage requirements of the device and does not degrade with high-temperature processing after trench formation. Those skilled in the art can appreciate that other materials exhibiting these properties may also be used.

A tenth step, also shown in FIG. 11, includes filling the trench with arsenic-doped amorphous silicon 7. This step may be performed by CVD process at around 500 to 600° C. Arsenic is preferable for the dopant because it diffuses slower than other dopants, such as phosphorus. Those skilled in the art can appreciate, however, that phosphorus or other dopants may be used if desired.

Figure 12:
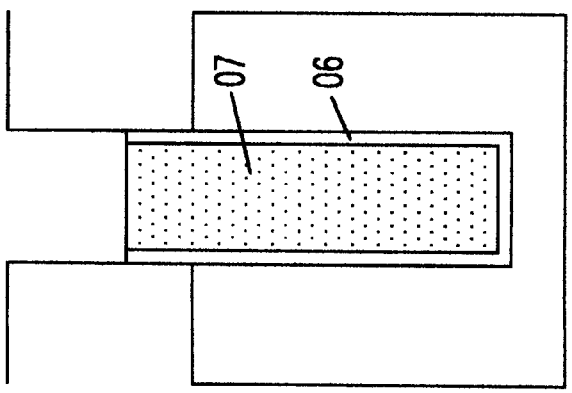

An eleventh step, shown in FIG. 12, includes etching back the top part of the node dielectric and the arsenic-dope silicon down to a depth of, for example, 1 micron from the silicon surface. This step may be performed by wet chemical etching. The remaining portion of the node dielectric and arsenic-doped silicon is at a level L above the buried plate capacitor, preferably by 1 micron.

Figure 13:
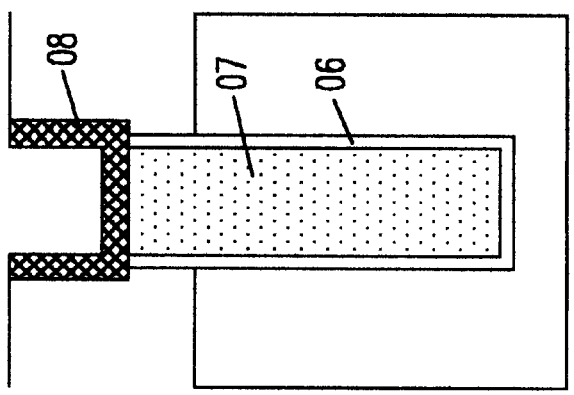

A twelfth step, shown in FIG. 13, includes forming an oxide layer 8 along the exposed sidewalls of the trench and across the top of the node dielectric and arsenic-doped silicon. The oxide layer may be 0.1 microns thick and is formed by an oxidation process which involves a short thermal oxidation and a CVD TEOS. As shown, the oxidation layer penetrates into the trench sidewalls.

Figure 14:
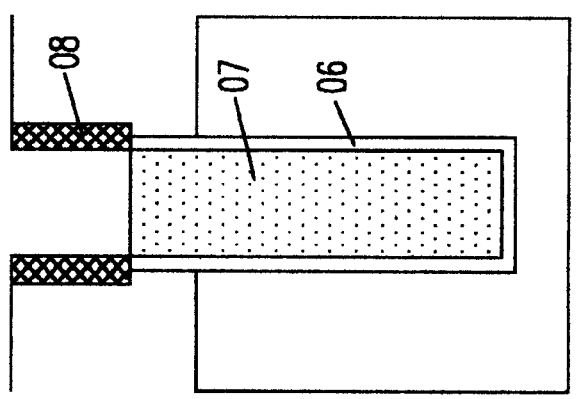

A thirteenth step, shown in FIG. 14, includes performing an isotropic etch to remove portions of the oxide layer 8 covering the node dielectric and arsenic-doped silicon. This step may be performed by reactive ion etching. RIE is preferable because it is highly directional, etching vertically mostly but not transversely. Consequently, the etch can be controlled so as not to substantially penetrate into the underlying node dielectric.

Figure 15:
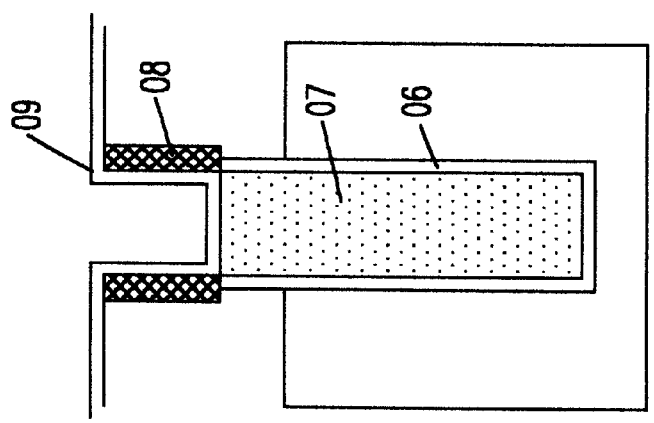

A fourteenth step, shown in FIG. 15, includes removing residual oxide formed on the underlying polysilicon located in the trench below the collar. This step may be performed for example, by an HF/water rinse. After the residual oxide is removed, a very thin layer of germanium 9 is formed within the trench along the oxide layer 8. Preferably, the germanium layer is less than 20 angstroms thick and is deposited in an LPCVD tool for example, at 500–700° C. and 1–3 micro Torr pressure.

Figure 16:
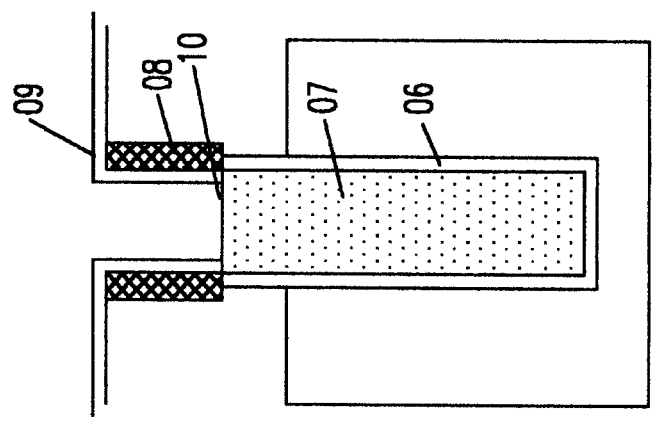

A fifteenth step, shown in FIG. 16, includes baking the substrate in a high vacuum, preferably at less than 10 micro Torr of pressure and between 450 to 700° C. for 5 to 10 minutes. During baking, the thin germanium layer 9 will react with the residual silicon oxide to form volatile germanium sub-oxide which is subsequently sublimed away to leave an oxide-free polysilicon surface 10. The subliming step may be performed in a high vacuum chamber fitted with a conventional heating element or a rapid thermal-annealing infrared light source.

Figure 17:
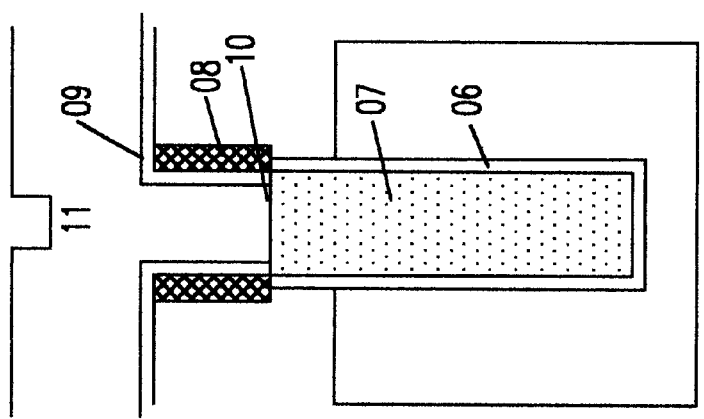
Figure 18:
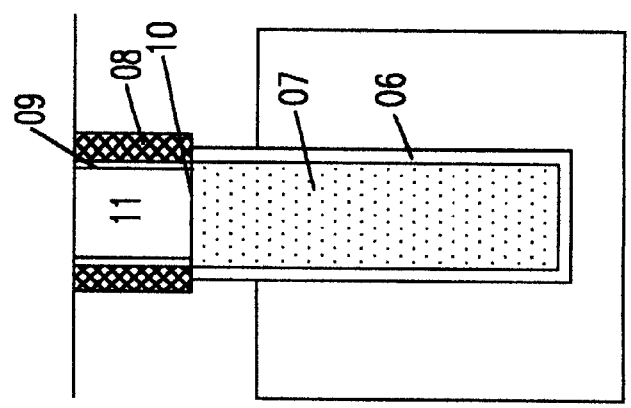

A sixteenth step, shown in FIGS. 17 and 18, includes back filling the top cavity of the trench with a second deposition of arsenic-doped polysilicon 11. Because the surface of the first polysilicon layer is now oxide-free, reduced contact resistance exists between the two polysilicon layers, as previously described with respect to the method of the present invention for performing surface oxide removal This polysilicon layer is then planarized to the top level of the trench, for example, by chemical-mechanical polishing (CMP).

Figure 19:
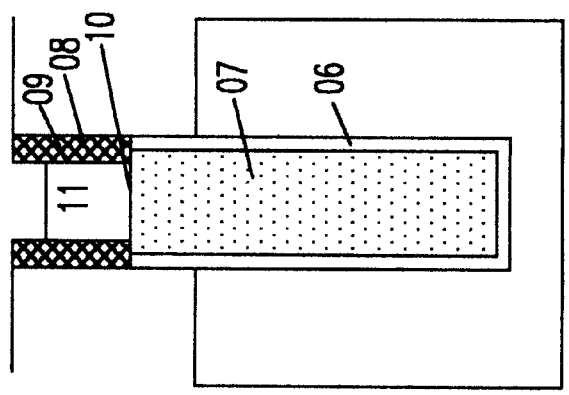

A seventeenth step, shown in FIG. 19, includes partially etching the second arsenic-doped polysilicon layer 11 back to form a recess A in the trench. Preferably, the depth of the etch (recess A) extends approximately 1000Å. This etch back is performed to remove the collar oxide from the trench wall in a subsequent step.

Figure 20:
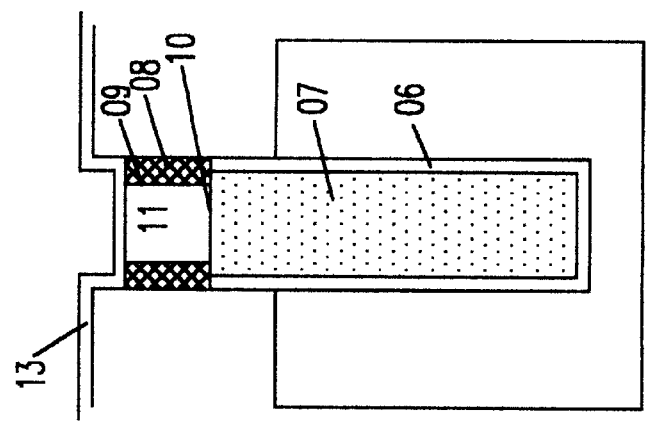

An eighteenth step, shown in FIG. 20, includes giving the substrate a short HF/Water rinse to remove oxide residue on the top of recessed polysilicon 11. A very thin layer of germanium 13 is then formed along the bottom and sidewalls of the recess. Preferably, this germanium layer is less than 20 angstroms thick and is formed in a LPCVD tool at between 500 and 700° C. and 1–3 micro Torr of pressure.

Figure 21:
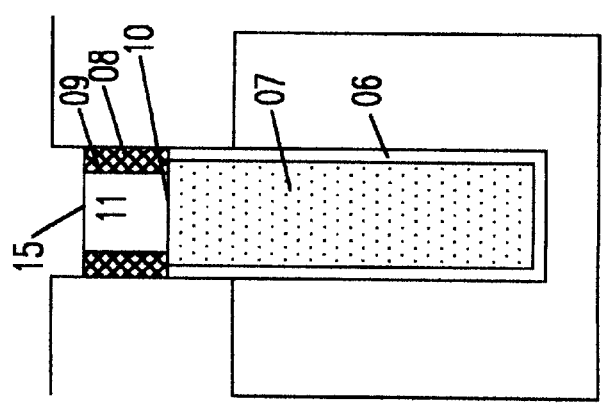

A nineteenth step, shown in FIG. 21, includes baking the substrate in a high vacuum, preferably at less than 10 micro T of pressure and between 450 to 700° C. for 5 to 10 minutes. During baking, the thin germanium layer 13 will react with residual silicon oxide to form volatile germanium sub-oxide. This sub-oxide is subsequently sublimed away, leaving an oxide-free polysilicon surface 15. The subliming step maybe performed in a high vacuum chamber fitted with a conventional heating element or a rapid thermal-annealing infrared light source.

Figure 23:
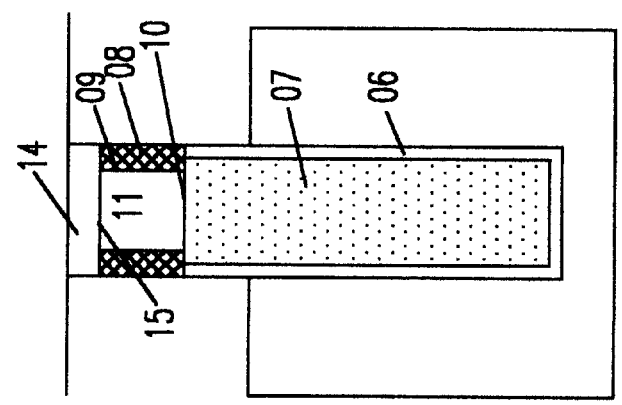
Figure 22:
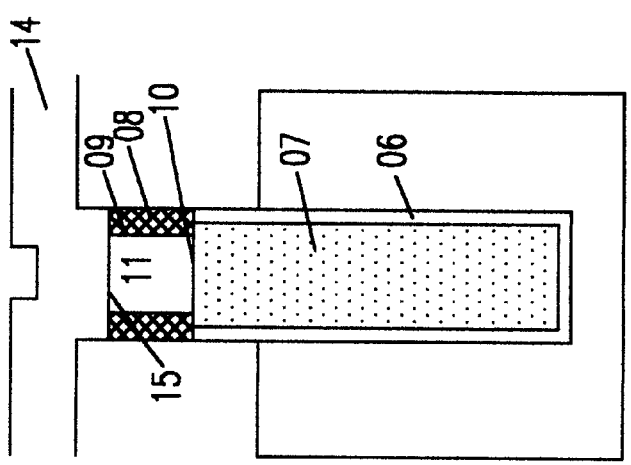

A twentieth step, shown in FIGS. 22 and 23, includes depositing a third layer of arsenic-doped polysilicon 14 over the oxide-fee polysilicon surface 15, and then planarizing layer 14 back to a level even with a top of the trench. The trench capacitor formed in accordance with the foregoing steps, thus, has two oxide-free polysilicon-polysilicon interfaces. Through these interfaces, the invention is able to achieve a lower contact resistance and faster charge/discharge times compared with conventional trench capacitors which contain oxides at their poly-poly interfaces.

The present invention also outperforms conventional methods by removing the need to process the polysilicon after an HF dip in order to prevent re-growth of the surface oxide. This is because the present invention completely removes the oxide on the polysilicon surface. As a result, the invention is easier to implement compared with conventional methods. Also, by using barrier layers to effect surface-oxide removal the present invention provides extra protection for wafers during polysilicon deposition in vertical furnaces without load lock thereby resulting in a trench capacitor with further improved performance.

Figure 24:
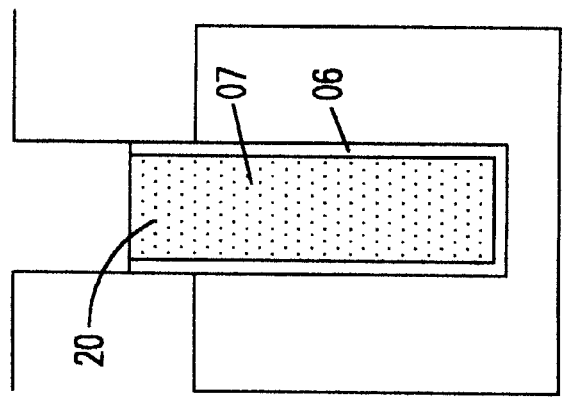

A second embodiment of the method of the present invention for forming an improved trench capacitor includes the same steps in the first embodiment except that arsenic-doped amorphous SiGe is used to fill the trench. Where applicable, reference will be made to the drawings discussed in connection with the first embodiment, including the reference numerals included therein. In the second embodiment, the steps are the same as the first embodiment except as indicated below, which includes a step where the trench is filled with arsenic-doped amorphous SiGe 20 as shown in FIG. 24.

After the SiGe fill is performed, subsequent steps of the method include partially etching back a top part of the node dielectric 6 and the arsenic-doped SiGe 20, and then performing an oxidation step to form oxide layer 8. An isotropic etch is then performed to expose the bottom part of the oxide layer 8, and residual oxide is removed by an HF/water rinse.

These steps are followed by the deposition of a very thin layer of germanium 9 which is preferably less than 20 angstroms thick. Deposition of this layer may be performed in an LPCVD tool, using but not limited to germanium at 500–700° C. and 1–3 micro Torr of pressure. The substrate is then baked in a high vacuum, preferably at less than 10 micro T and between 450 and 600° C. for 5 to 10 minutes, during which time the germanium layer 9 will react with the residual silicon oxide to form volatile germanium sub-oxide. This sub-oxide is subsequently sublimed away, leaving an oxide-free deposited silicon surface 10. This can be done in a high vacuum chamber fitted with a conventional heating element or a rapid thermal-annealing IR heat source.

Figure 25:
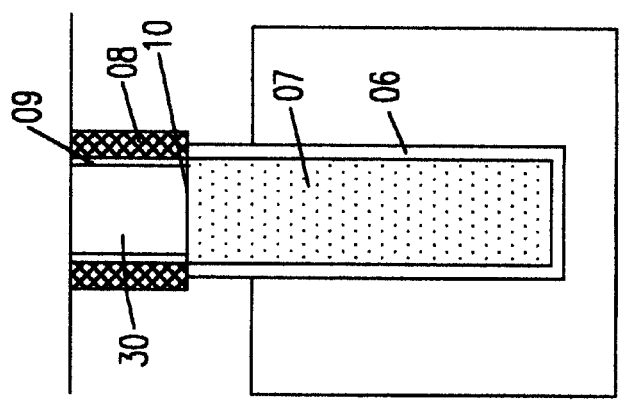

Unlike the first embodiment, the top cavity of the trench is now backed-filled with a second deposition of arsenic-doped SiGe 30. (See FIG. 25). Layer 30 is then planarized back using chemical-mechanical polishing, and then partially etched back to form recess A. The substrate is given a short HF/Water rinse to remove the oxide residue on the top of the recessed SiGe layer, and a very thin layer of germanium (preferably less than 20 angstroms) is deposited in a LPCVD tool, using but not limited to germanium at 500–700° C. and 1–3 micro Torr of pressure. The substrate is then baked in high vacuum preferably at less than 10 micro Torr of pressure and between 450 to 600° C. for 5 to 10 minutes.

Figure 26:
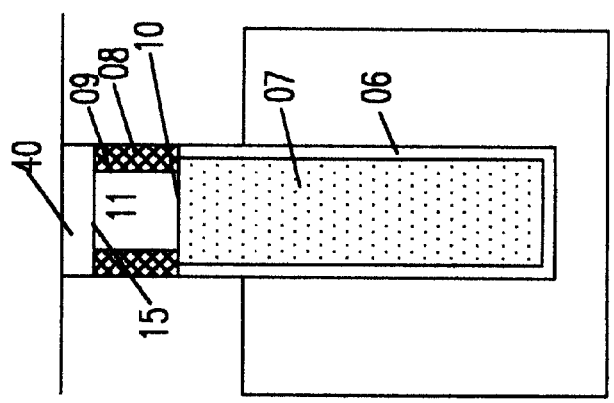
FIGS. 24–26 shows steps in the second embodiment of the method of the present invention for forming a trench capacitor, where the trench is filled with multiple layers of arsenic-doped amorphous SiGe. The remaining steps of the second method are analogous to the first embodiment.

During this time, the thin germanium will react with the residual silicon oxide to form volatile germanium sub-oxide, which is subsequently sublimed away to leave an oxide-free deposited silicon surface 15. As before, this step may be performed in a high vacuum chamber fitted with a conventional heating element or a rapid thermal-annealing IR heat source. A third layer of arsenic-doped amorphous SiGe 40 may be formed over the oxide-free surface of the second SiGe layer, (See FIG. 26).

In the second embodiment, the invention replaces the doped polysilicon material conventionally used for the capacitor plates with heavily doped silicon-germanium. Because germanium is chemically less susceptible to oxidation and has a lower electronic band gap, the resulting capacitor plate, which may be referred to as a SiGe-SiGe trench "plug," demonstrates much lower bulk electrical resistance than conventional poly-poly "plugs." In addition, the trench capacitor formed from SiGe plates exhibits less contact resistance between the two fills. This advantageously results in faster charging and discharging times compared with trench capacitors using conductor plates made from heavily doped polysilicon In an alternative embodiment, instead of SiGe, the conductor plates of the trench capacitor of the present invention may be formed from germanium.

With respect to both embodiments of the method of the present invention, it is noted that the general concept of making a trench capacitor has been disclosed, for example, in the article entitled "A 0.6 um 2 256 Mb Trench DRAM Cell with Self Aligned Buried Strap (BEST)", IDED Tech. Digest, 1993, p 627. His article, however, does not address the issue of residual oxide on polysilicon and of providing an oxide-free deposited silicon surface in accordance with the method of the present invention.

Other modifications and variations to the invention will be apparent to those skilled in the art from the foregoing disclosure. Thus, while only certain embodiments of the invention have been specifically described herein, it will be apparent that numerous modifications may be made thereto without departing from the spirit and scope of the invention. For example, other than a trench capacitor, the Ge sublimation method of the present invention may be used to remove oxides on polysilicon gates before silicidation, and in contacts to gates/diffusion processes prior to stud formation for wiring levels.

We claim:

1. A method for removing surface oxide from polysilicon, comprising:
   providing a first polysilicon layer having a surface oxide layer;
   depositing a barrier layer on the surface oxide layer;
   baking the first polysilicon, surface oxide, and barrier layers until the barrier layer reacts with the surface oxide layer to form a volatile sub-oxide layer; and
   subliming the sub-oxide layer away to leave the first polysilicon layer with an oxide-free surface.

2. The method of claim 1, wherein the barrier layer includes at least one layer of germanium.

3. The method of claim 1, further comprising:
   depositing a second polysilicon layer on the oxide-free surface of the first polysilicon layer.

4. A method for forming a trench capacitor, comprising:
   forming a trench in a substrate;
   filling a portion of said trench with a first polysilicon layer, said first polysilicon layer having a surface oxide layer;
   depositing a barrier layer on the surface oxide layer;
   baking said first polysilicon, surface oxide, and barrier layers until said barrier layer reacts with said surface oxide layer to form a volatile sub-oxide layer; and
   subliming the sub-oxide layer away to leave said first polysilicon layer with an oxide-free surface.

5. The method of claim 4, wherein said barrier layer includes germanium.

6. The method of claim 4, further comprising:
   depositing a second polysilicon layer on the oxide-free surface of said first polysilicon layer within said trench, said second polysilicon layer having a surface oxide layer.

7. The method of claim 6, further comprising:
   depositing a barrier layer on the surface oxide layer of said second polysilicon layer;
   baking said second polysilicon, surface oxide, and barrier layers until said barrier layer reacts with said surface oxide layer to form a volatile sub-oxide layer; and
   subliming the sub-oxide layer away to leave said second polysilicon layer with an oxide-free surface.

8. The method of claim 7 wherein the barrier layer deposited on the surface oxide layer of said second polysilicon layer includes germanium.

9. The method of claim 7, further comprising:
   depositing a third polysilicon layer on the oxide-free surface of said second polysilicon layer.

10. The method of claim 4, wherein said first polysilicon layer is an arsenic-doped amorphous silicon layer.

11. The method of claim 6, wherein said second polysilicon layer is an arsenic-doped amorphous silicon layer.

12. The method of claim 9, wherein said third polysilicon layer is an arsenic-doped amorphous silicon layer.

13. The method of claim 4, wherein said first polysilicon layer is an arsenic-doped amorphous SiGe layer.

14. The method of claim 6, wherein said second polysilicon layer is an arsenic-doped amorphous SiGe layer.

15. The method of claim 9, wherein said third polysilicon layer is an arsenic-doped amorphous SiGe layer.

16. A trench capacitor, comprising:
   a first deposited silicon layer formed in a trench etched into a semiconductor substrate; and
   a second deposited silicon layer formed on said first deposited silicon layer after removal of a native oxide formed on said first deposited silicon layer by reaction with a barrier layer deposited thereon to form a sub-oxide thereof and sublimation away of said sub-oxide,
   such that an interface between said first deposited silicon layer and said second deposited silicon layer in said trench is an oxide-free interface.

17. The trench capacitor of claim 16, wherein said first deposited silicon layer and said second deposited silicon layer are ones selected from a group consisting of amorphous silicon and amorphous SiGe.

18. The trench capacitor of claim 16, further comprising:
   a third deposited silicon layer formed on said second deposited silicon layer after removal of a native oxide formed on said second deposited silicon layer by reaction with a barrier layer deposited thereon to form a sub-oxide thereof and sublimation away of said sub-oxide,
   such that an interface between said second deposited silicon layer and said third deposited silicon layer in said trench is an oxide-free interface.

19. The trench capacitor of claim 18, wherein said third deposited silicon layer is one of amorphous silicon and amorphous SiGe.

* * * * *